(12) United States Patent
Chen

(10) Patent No.: US 12,538,795 B2
(45) Date of Patent: Jan. 27, 2026

(54) SEMICONDUCTOR COMPONENT AND SEMICONDUCTOR DEVICE

(71) Applicant: Ganstronic INC., Tainan (TW)

(72) Inventor: Cheng-Chuan Chen, Tainan (TW)

(73) Assignee: Ganstronic INC., Tainan (TW)

( * ) Notice: Subject to any disclaimer, the term of this patent is extended or adjusted under 35 U.S.C. 154(b) by 426 days.

(21) Appl. No.: 18/225,846

(22) Filed: Jul. 25, 2023

(65) Prior Publication Data

US 2024/0047293 A1   Feb. 8, 2024

Related U.S. Application Data

(60) Provisional application No. 63/370,493, filed on Aug. 4, 2022.

(30) Foreign Application Priority Data

Oct. 5, 2022   (TW) .................................. 111137827

(51) Int. Cl.
   *H01L 23/367*   (2006.01)
   *H10D 30/47*   (2025.01)
   *H10D 62/85*   (2025.01)
(52) U.S. Cl.
   CPC ......... *H01L 23/367* (2013.01); *H10D 30/475* (2025.01); *H10D 62/8503* (2025.01)

(58) Field of Classification Search
   None
   See application file for complete search history.

(56) References Cited

U.S. PATENT DOCUMENTS

2024/0047293 A1*   2/2024   Chen .................... H10D 30/475

FOREIGN PATENT DOCUMENTS

| TW | 201909422 A | 3/2019 |
|---|---|---|
| TW | 202018819 A | 5/2020 |

* cited by examiner

*Primary Examiner* — Jack S Chen
(74) *Attorney, Agent, or Firm* — CKC & Partners Co. LLC

(57) ABSTRACT

A semiconductor component is provided in the present invention. The semiconductor component includes a substrate, a semiconductor working layer disposed on the substrate, an insulating layer disposed on an upper surface of the semiconductor working layer, plural conducting electrodes, and at least a metal layer floated on the upper surface of the semiconductor working layer and within the insulating layer. The conducting electrodes include plural working electrodes disposed within the insulating layer and plural connecting electrodes disposed over the upper surface of the semiconductor working layer. By floating the at least a metal layer on the semiconductor working layer and controlling occupied area of the metal layer and the conducting electrodes on the upper surface of the semiconductor working layer, heat dissipation performance of the semiconductor component can be effectively increased.

20 Claims, 4 Drawing Sheets

SEMICONDUCTOR COMPONENT AND SEMICONDUCTOR DEVICE

RELATED APPLICATION

This application claims priority to U.S. Provisional Application Ser. No. 63/370,493, filed Aug. 4, 2022, and Taiwan Application Serial Number 111137827, filed Oct. 5, 2022, the disclosures of which are incorporated herein by reference in their entireties.

BACKGROUND

Field of Invention

The present invention relates to a semiconductor component. More particularly, the present invention relates to a semiconductor component with heat dissipation.

Description of Related Art

A power semiconductor component is a component related to power supply and electric control application, in which the power semiconductor component has main characteristics of high operating power and fast switching rate, thereby contributing to decrease on-state resistance and increase power conversion efficiency. Traditional power semiconductors are designed by using Si as a substrate. However, in recent years, application of third-generation semiconductor material such as GaN in the power semiconductor component is gradually increasing.

Basically, the power semiconductors are divided into a power discrete component and a power integrated circuit (power IC), in which the power discrete component includes a metal oxide semiconductor field effect transistor (MOSFET), a diode and an insulated gate bipolar transistor (IGBT).

Since the power semiconductors have great application proportion in automobile industry, and electric vehicles have greater demand for the power components than traditional fossil fuel vehicles, requirements for the power component will increase with growing of the electric vehicle industry. Moreover, the progress of semiconductor is to cause the power semiconductor components have greater power, but brings the heat dissipation within the components. If the problems of heat dissipation cannot be solved, the power of the power semiconductor component cannot be further increased.

SUMMARY

An aspect of the present invention provides a semiconductor component, which includes a metal layer on a semiconductor working layer, and heat dissipation performance of the semiconductor component can be increased.

Another aspect of the present invention provides a semiconductor device, which includes a semiconductor component with a metal layer to increase heat dissipation performance.

According to the aspect of the present invention, providing a semiconductor component, which includes a substrate, a semiconductor working layer disposed on the substrate, an insulating layer disposed over the upper surface of the semiconductor working layer, plural conducting electrodes, and at least a metal layer floated on the upper surface of the semiconductor working layer and disposed within the insulating layer. The conducting electrodes include plural working electrodes disposed within the insulating layer and plural connecting electrodes disposed over the upper surface of the semiconductor working layer. The connecting electrodes are connected to the working electrodes. The metal layer is not in contact with the conducting electrodes and is electrically insulated from any one of the conducting electrodes. An upper surface of the semiconductor working layer has a first area. A total area of the connecting electrodes occupying the upper surface of the semiconductor working layer is a second area. A total area of the metal layer occupying the upper surface of the semiconductor working layer is a third area. Sum of the second area and the third area is less than the first area. A ratio of the sum of the second area and the third area to the first area is 0.5 to 0.9.

According to an embodiment of the present invention, the second area is less than the third area.

According to an embodiment of the present invention, a ratio of the third area to the first area is 0.3 to 0.8.

According to an embodiment of the present invention, the conducting electrodes and the at least a metal layer includes a eutectic material, respectively, and the eutectic material is selected from a group consisting of Au, Au/Sn, Sn/Ag/Bi, Sn/Ag/Bi/Cu, Sn/Ag/Cu and combinations thereof.

According to an embodiment of the present invention, the semiconductor working layer includes at least a carrier channel layer and at least a carrier barrier layer, and two-dimensional electron gas (2DEG) is located between the at least a carrier channel layer and the at least a carrier barrier layer.

According to an embodiment of the present invention, the carrier channel layer includes GaN, and the carrier barrier layer includes AlGaN.

According to an embodiment of the present invention, the semiconductor component is power semiconductor component, and the power semiconductor component includes diodes and transistors.

According to an embodiment of the present invention, when the power semiconductor component includes transistors, the conducting electrodes include at least a source electrode, at least a drain electrode and at least a gate electrode.

According to an embodiment of the present invention, when the power semiconductor component includes diodes, the conducting electrodes include at least a source electrode and at least a drain electrode.

According to an embodiment of the present invention, the substrate is selected from a group consisting of sapphire, Si, $Ga_2O_3$, GaN, a composite material of Si—$SiO_2$, a composite material of Si—AlN, metal and combinations thereof.

According to another aspect of the present invention, providing a semiconductor device, which includes a thermoelectric separating substrate and at least a semiconductor component disposed on the thermoelectric separating substrate. The semiconductor component includes a substrate, a semiconductor working layer disposed on the substrate, an insulating layer disposed over the upper surface of the semiconductor working layer, plural working electrodes disposed within the insulating layer, plural connecting electrodes disposed on the semiconductor working layer, and at least a metal layer floated on the semiconductor working layer. The connecting electrodes are electrically connected to the working electrodes. An upper surface of the semiconductor working layer has a first surface area, a total area of the connecting electrodes occupying the upper surface of the semiconductor working layer is a second surface area, and a total area of the at least a metal layer occupying the upper surface of the semiconductor working layer is a third surface area. A ratio of sum of the second surface area and the third surface area to the first surface area is 0.5 to 0.9.

According to an embodiment of the present invention, the second surface area is less than the third surface area.

According to an embodiment of the present invention, a ratio of the third surface area to the first surface area is 0.3 to 0.8.

According to an embodiment of the present invention, the at least a metal layer is not in contact with the connecting electrodes.

According to an embodiment of the present invention, the semiconductor device further includes a thermal conducting metal layer disposed below the thermoelectric separating substrate.

According to an embodiment of the present invention, the insulating layer includes $SiO_2$, $Si_3N_4$, $Al_2O_3$, nano diamond or combinations thereof.

According to an embodiment of the present invention, the at least a semiconductor component is bonded to the thermoelectric separating substrate by metal bonding.

According to an embodiment of the present invention, the thermoelectric separating substrate includes an electrical conductive circuit layer and a thermal conductive metal layer, the connecting electrodes are bonded to the electrical conductive circuit layer, and the at least a metal layer is bonded to the thermal conductive metal layer.

According to an embodiment of the present invention, the thermoelectric separating substrate is a ceramic-metal composite substrate or a polymer-metal composite substrate.

According to an embodiment of the present invention, metal of the ceramic-metal composite substrate includes Cu or Cu/Al alloy, and ceramic material of the ceramic-metal composite substrate includes aluminum nitride, aluminum oxide or silicon nitride.

In the application of the semiconductor component of the present invention, the heat dissipation performance of the semiconductor component can be effectively improved by floating at least a metal layer on the semiconductor working layer and by controlling the areas of the metal layer and the conducting electrodes occupying the upper surface of the semiconductor working layer.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
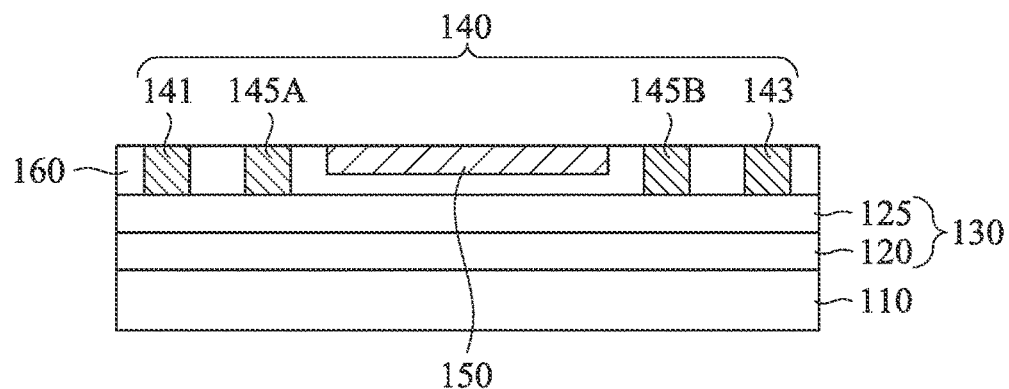
FIG. 1A illustrates a cross-sectional diagram of a semiconductor component according to some embodiments of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range.

Traditionally, semiconductor devices with flip-chip package only use metal column or metal ball to perform heat dissipation. However, as for power semiconductor devices, the heat dissipation performance of the traditional device is not suitable for the power semiconductor devices with greater power (such as greater than 100 watt) to effectively perform heat dissipation. Therefore, the present disclosure provides a semiconductor device, and the heat dissipation performance of the semiconductor device can be effectively improved by floating at least a metal layer on the semiconductor working layer and by controlling areas of the metal layer and the connecting electrodes occupying the upper surface of the semiconductor working layer. Hence, it can be applied to high power semiconductor device. It should be understood that power of the high-power semiconductor device is greater than or equal to 100 watt.

Referring to FIG. 1A, which illustrates a cross-sectional diagram of a semiconductor component 100 according to some embodiments of the present invention, the semiconductor component 100 includes a substrate 110 and a semiconductor working layer 130 on the substrate 110. In some embodiments, the substrate 110 may be sapphire substrate, Si substrate, $Ga_2O_3$ substrate, GaN substrate, a composite substrate of Si—$SiO_2$, a composite substrate of Si—AlN, metal substrate or combinations thereof. In some embodiments, the semiconductor working layer 130 includes a carrier channel layer 120 and a carrier barrier layer 125, and there's two-dimensional electron gas (2DEG) located between the carrier channel layer 120 and the carrier barrier layer 125. In some embodiments, the carrier channel layer 120 includes GaN, and the carrier barrier layer 125 includes AlGaN. In some embodiments, the semiconductor component 100 may optionally include a buffer layer (not shown) disposed between the substrate 110 and the semiconductor working layer 130, and the buffer layer may include GaN, AlN or AlGaN.

The semiconductor component 100 includes plural conducting electrodes 140. The conducting electrodes 140 include connecting electrodes disposed over the upper surface of the semiconductor working layer 130. In some embodiments, the connecting electrodes of conducting electrodes 140 include a drain electrode 141, a source electrode 143, a gate electrode 145A and a gate electrode 145B. It should be understood that amounts and types of the conducting electrodes 140 is not limited to aforementioned group. In some embodiments, the conducting electrodes 140 include a eutectic material, which may be Au, Au/Sn, Sn/Ag/Bi, Sn/Ag/Bi/Cu, Sn/Ag/Cu or combinations thereof.

Figure 1B:
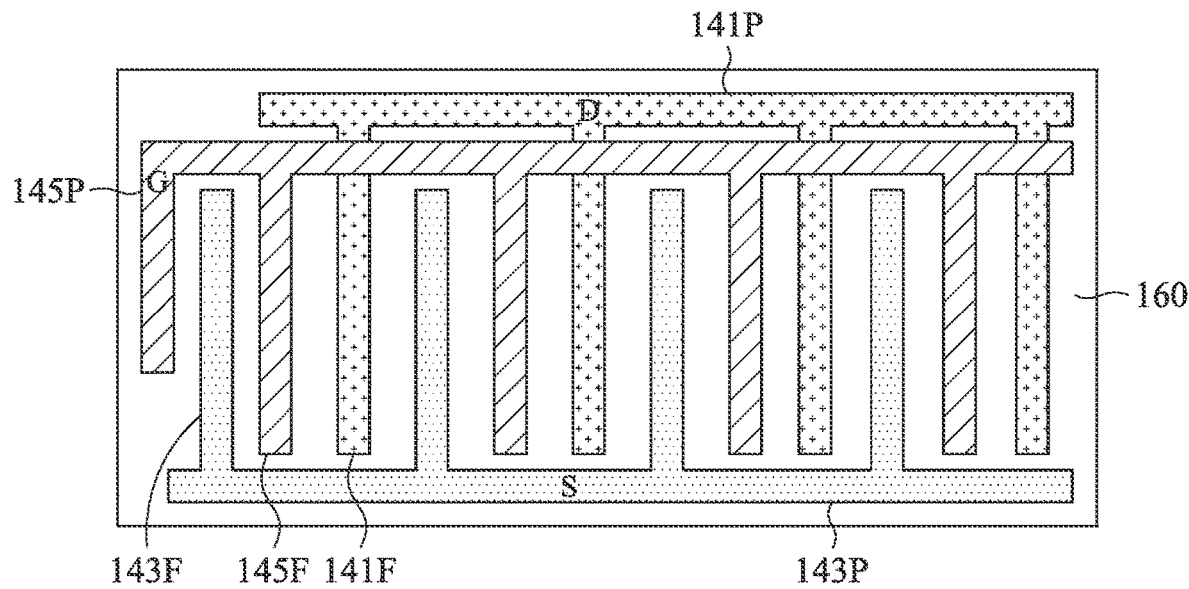
FIG. 1B illustrates a top view of a semiconductor component according to some embodiments of the present invention.

Referring to FIG. 1B, FIG. 1B illustrates a top view of a semiconductor component according to some embodiments of the present invention. FIG. 1B depicts the top view of an insulating layer 160. The conducting electrodes 140 further include working electrodes disposed within the insulating layer 160. The working electrodes of the drain electrode include multiple drain fingers 141F and a drain pad 141P, and the drain fingers 141F are connected to the drain pad 141P on lower side of the insulating layer 160. The working electrodes of the source electrode include multiple source fingers 143F and a source pad 143P, and the source fingers 143F are connected to the source pad 143P on upper side of the insulating layer 160. The working electrodes of the gate electrode include multiple gate fingers 145F and a gate pad 145P, and the gate fingers 145F are connected to the gate pad 145P on left side of the insulating layer 160. In other embodiments, some of the gate fingers 145F are connected to the gate pads on left side of the insulating layer 160, while others of the gate fingers 145F are connected to another gate pads on right side of the insulating layer 160. The drain pad 141P, the source pad 143P and the gate pad 145P are vertically connected to the working electrodes of the conducting electrodes 140. Moreover, the drain fingers 141F, the source fingers 143F and the gate fingers 145F are covered by the insulating layer 160.

Referring to FIG. 1A again, the semiconductor component 100 includes a metal layer 150 floated on the upper surface of the semiconductor working layer 130, that is, the metal layer 150 is not in contact with the semiconductor working layer 130. The metal layer 150 is not in contact with any one of the conducting electrodes 140 (or connecting electrodes) and is electrically insulated from each one of the conducting electrodes 140 (or connecting electrodes). The metal layer 150 functions as a thermal pad. In some embodiments, the material of the metal layer 150 may be copper, aluminum, silver, gold, alloy thereof or other metal materials with better thermal conductivity. In some embodiments, the metal layer 150 further includes an eutectic material on the metal material, which may be Au, Au/Sn, Sn/Ag/Bi, Sn/Ag/Bi/Cu, Sn/Ag/Cu or combinations thereof.

In some embodiments, the semiconductor component 100 includes an insulating layer 160 disposed over the semiconductor working layer 150. The conducting electrodes 140 and the metal layer 150 are disposed within the insulating layer 160 to isolate the conducting electrodes 140 and the metal layer 150. In some embodiments, the insulating layer 160 includes silicon dioxide ($SiO_2$), silicon nitride ($Si_3N_4$), aluminum oxide ($Al_2O_3$) and combinations thereof. In some embodiments, the semiconductor component 100 is the power semiconductor component, and the power semiconductor component 100 includes a transistor. When the power semiconductor component 100 includes the transistor, the conducting electrodes include at least a source electrode, at least a drain electrode and at least a gate electrode. In addition, in other embodiments, the power semiconductor component not only includes the transistor, but also includes diodes. When the power semiconductor component 100 includes the diodes, the conducting electrodes include at least a source electrode and at least a drain electrode. In some embodiments, the power of the semiconductor component 100 may be greater than or equal to 100 watt, for example, 100 watt to 2000 watt. In some embodiments, dimensions (e.g. area) of the semiconductor component 100 may be 4 $mm^2$ to 400 $mm^2$, for example, 2 mm×2 mm to 20 mm×20 mm.

Figure 2A:
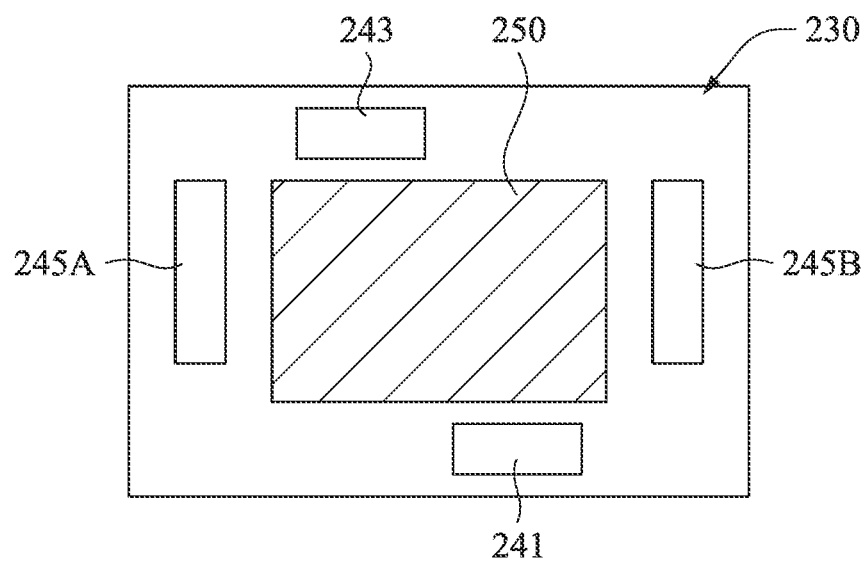
FIGS. 2A-2D illustrate top views of a semiconductor component according to some embodiments of the present invention.

Referring to FIGS. 2A-2D, FIGS. 2A-2D illustrate top views of a semiconductor component according to some embodiments of the present invention. Referring to FIG. 2A, the conducting electrodes (including the drain electrode 241, the source electrode 243, the gate electrode 245A and the gate electrode 245B) and the metal layer 250 are disposed on the upper surface of the semiconductor working layer 230, in which the conducting electrodes are disposed around the metal layer 250.

Figure 2B:
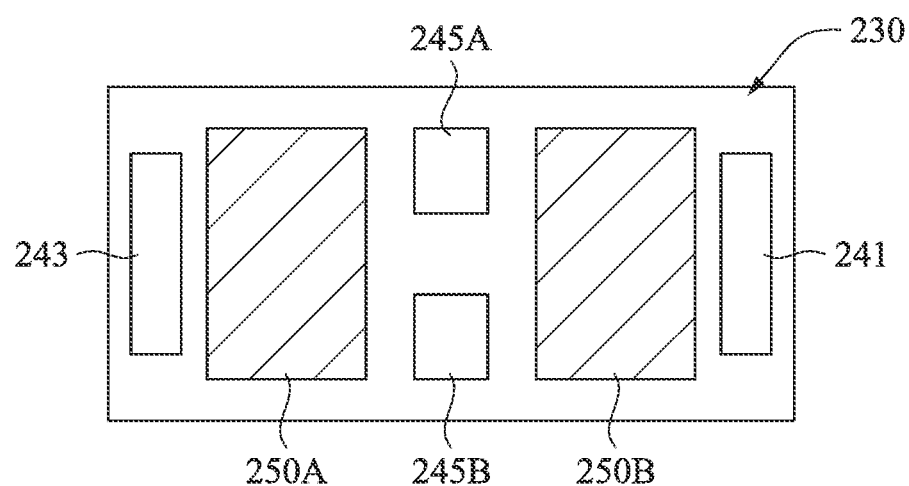

Referring to FIG. 2B, the drain electrode 241 and the source electrode 243 are disposed at two ends of the semiconductor working layer 230, respectively, and the gate electrode 245A and the gate electrode 245B are disposed between the drain electrode 241 and the source electrode 243. The metal layer 250A is disposed between the source electrode 243 and the gate electrodes 245A and 245B, and the metal layer 250B is disposed between the drain electrode 241 and the gate electrodes 245A and 245B. Although the conducting electrodes illustrated in FIGS. 2A and 2B are metal electrode pads, the present invention is not limited thereto. In other words, in such arrangement, the round electrodes or the electrodes with other shapes may be used.

Figure 2C:
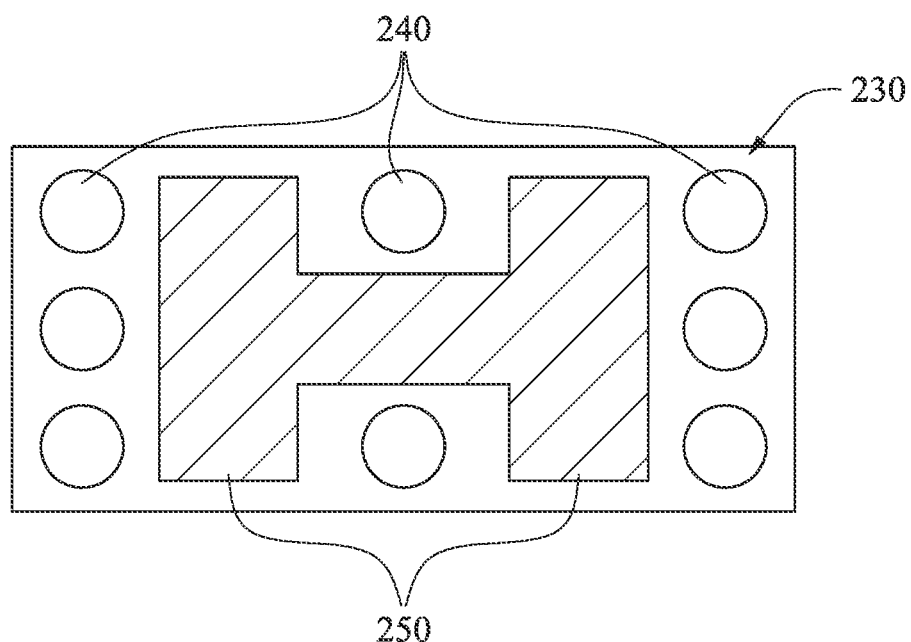
Figure 2D:
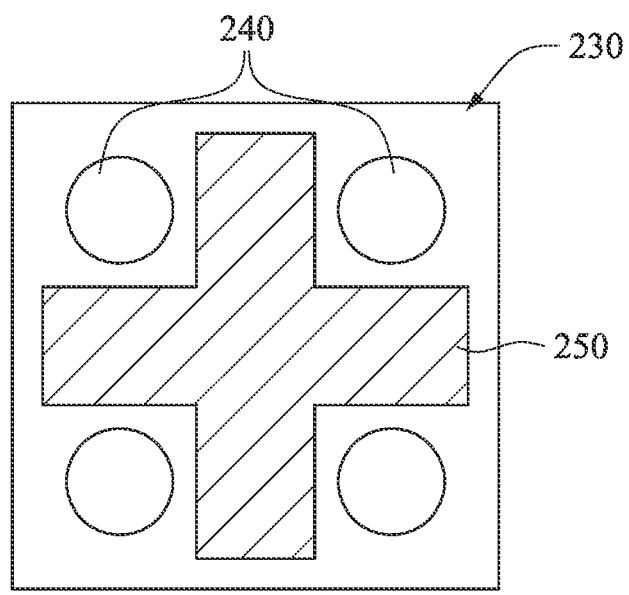

Referring to FIG. 2C, the conducting electrodes 240 and the metal layer 250 are disposed on the semiconductor working layer 230, and the metal layer 250 is disposed between the conducting electrodes 240, in which the metal layer 250 is configured as "H-shape" to increase thermal conductive areas. Referring to FIG. 2D, the conducting electrodes 240 are disposed at four corners of the semiconductor working layer 230, and the metal layer 250 is disposed at center of the semiconductor working layer 230 and separated from the four conducting electrodes 240. Although the conducting electrodes in FIGS. 2C and 2D are illustrated as round electrodes, the present invention is not limited thereto. In other words, in such arrangement, the metal electrode pads or the electrodes in other shapes may be used.

In the above embodiments illustrated in FIGS. 2A-2D, the upper surface of the semiconductor working layer 230 is considered as a first area, total areas of the conducting electrodes 240 occupying the upper surface of the semiconductor working layer 230 is considered as a second area, and total areas of the metal layer 250 occupying the upper surface of the semiconductor working layer 230 is considered as a third area. It is understood that the conducting electrodes 240 and the metal layer 230 both have thermal conduction effect. In some embodiments, the second area is less than the third area; thus, thermal conduction effect may be increased. In some embodiments, a ratio of sum of the second area and the third area to the first area is about 0.5 to about 0.9; thus, most of the regions on the semiconductor working layer 230 have thermal conduction effect. In some embodiments, a ratio of the third area to the first area is about 0.3 to about 0.8, and thus the metal layer 250 with better thermal conduction effect occupied greater area on the upper surface of the semiconductor working layer 230.

Figure 3:
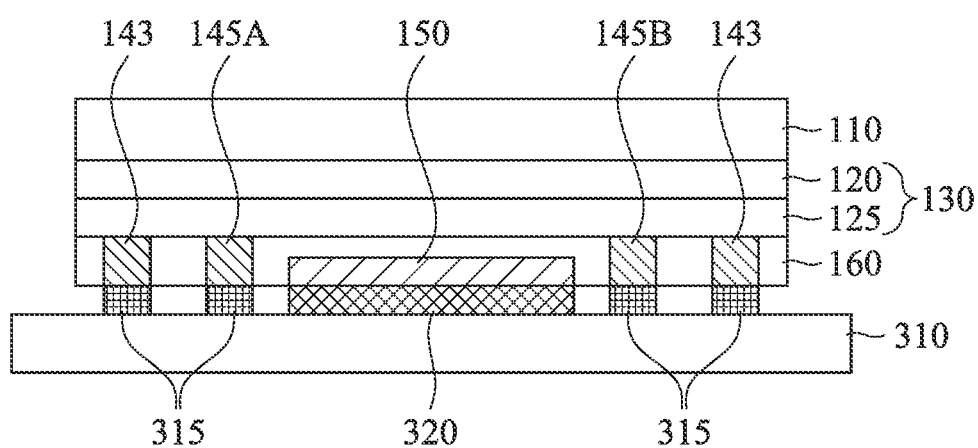
FIG. 3 illustrates a cross-sectional diagram of a semiconductor device according to some embodiments of the present invention.

Referring to FIG. 3, FIG. 3 illustrates a cross-sectional diagram of a semiconductor device 300 according to some embodiments of the present invention. As shown in FIG. 3, the semiconductor device 300 includes the semiconductor component 100 (including the substrate 110 and the semiconductor working layer 130, but not shown in FIG. 3) flip-chip bonding on a thermoelectric separating substrate 310. In some embodiments, the thermoelectric separating substrate 310 has an electrical conductive circuit layer 315 and a thermal conductive metal layer 320. In some examples, the thermoelectric separating substrate 310 is a composite substrate including electrical conductive circuit layer and thermal conductive polymer material. In other examples, the thermoelectric separating substrate 310 is a composite substrate including electrical conductive circuit layer and thermal conductive ceramic material, which may be a metal-ceramic composite substrate, such as copper-ceramic substrate or Cu/Al-ceramic substrate, in which material of the ceramic substrate may be aluminum nitride, aluminum oxide or silicon nitride ($Si_3N_4$).

In some embodiments, the metal-ceramic composite substrate is formed by direct bonded copper (DBC), direct plated copper (DPC), active metal brazing (AMB), or other suitable process. In some embodiments, the metal-ceramic composite substrate can be formed of aluminum oxide or aluminum nitride and copper by DBC process. In other embodiments, the metal-ceramic composite substrate can be formed of silicon nitride and copper by AMB process. Since silicon nitride has high thermal conductivity, high thermal shock resistance and great mechanical properties at high temperature, the ceramic substrate of silicon nitride can bond to metal layer with greater thickness, such as copper layer with thickness in range of 500 µm to 1000 µm, or even greater. It is understood that if the metal layer of the metal-ceramic composite substrate has greater thickness, the metal-ceramic composite substrate has better heat dissipation performance.

In some embodiments, the conducting electrodes 140 and the metal layer 150 of the semiconductor component 100 are bonded to the electrical conductive circuit layer 315 and the thermal conductive metal layer 320 of the thermoelectric separating substrate 310, respectively, and it may use metal bonding such as high-temperature metal eutectic or metal sintering to bond with the thermoelectric separating substrate 310. In other embodiments, plural the semiconductor components 100 may be flip-chip bonded on the same thermoelectric separating substrate 310. It is understood that the metal layer 150 is not in contact with the conducting electrodes 140 and not connected to the electrical conductive circuit layer 315 of the thermoelectric separating substrate 310, so the metal layer 150 is not engaged in electric operation between the conducting electrodes 140 and the thermoelectric separating substrate 310, or electric operation of the semiconductor component 100. In other words, the metal layer 150 is only used for thermal conduction, but not engaged in electric operation of the semiconductor component 100 (e.g. chip); thereby, it may be designed as not electrically contact to any electric conducting circuit or only grounded. Therefore, the metal layer 150 and the conducting electrodes 140 disposed on the upper surface of the semiconductor working layer 130 can increase thermal conductive path of the semiconductor device 300. In some embodiments, the semiconductor device further includes a thermal metal layer disposed below the thermoelectric separating substrate to further increase heat dissipation performance.

As described above, the present disclosure provides a semiconductor component, the heat dissipation performance of the semiconductor component can be effectively increased by floating at least a metal layer on the semiconductor working layer and controlling areas of the metal layer and the conducting electrodes occupying the upper surface of the semiconductor working layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor component, comprising:
    a substrate;
    a semiconductor working layer, disposed on the substrate, wherein an upper surface of the semiconductor working layer has a first area;
    an insulating layer, disposed over the upper surface of the semiconductor working layer;
    a plurality of conducting electrodes, comprising:
        a plurality of working electrodes, disposed within the insulating layer; and
        a plurality of connecting electrodes, disposed over the upper surface of the semiconductor working layer and connected to the working electrodes, wherein a total area of the connecting electrodes occupying the upper surface of the semiconductor working layer is a second area; and
    at least a metal layer, floated on the upper surface of the semiconductor working layer and disposed within the insulating layer, wherein the at least a metal layer is not in contact with the conducting electrodes, the at least a metal layer is electrically insulated from any one of the conducting electrodes, a total area of the at least a metal layer occupying the upper surface of the semiconductor working layer is a third area, sum of the second area and the third area is less than the first area, and a ratio of the sum of the second area and the third area to the first area is 0.5 to 0.9.

2. The semiconductor component of claim 1, wherein the second area is less than the third area.

3. The semiconductor component of claim 1, wherein a ratio of the third area to the first area is 0.3 to 0.8.

4. The semiconductor component of claim 1, wherein the conducting electrodes and the at least a metal layer comprises a eutectic material, respectively, and the eutectic material is selected from a group consisting of Au, Au/Sn, Sn/Ag/Bi, Sn/Ag/Bi/Cu, Sn/Ag/Cu and combinations thereof.

5. The semiconductor component of claim 1, wherein the semiconductor working layer comprises at least a carrier channel layer and at least a carrier barrier layer, and two-dimensional electron gas (2DEG) is located between the at least a carrier channel layer and the at least a carrier barrier layer.

6. The semiconductor component of claim 5, wherein the at least a carrier channel layer comprises GaN, and the at least a carrier barrier layer comprises AlGaN.

7. The semiconductor component of claim 1, wherein the semiconductor component is power semiconductor component, and the power semiconductor component comprises diodes and transistors.

8. The semiconductor component of claim 7, wherein the power semiconductor component comprises transistors, the conducting electrodes comprise at least a source electrode, at least a drain electrode and at least a gate electrode.

9. The semiconductor component of claim 7, wherein the power semiconductor component comprises diodes, the conducting electrodes comprise at least a source electrode and at least a drain electrode.

10. The semiconductor component of claim 1, wherein the substrate is selected from a group consisting of sapphire, Si, $Ga_2O_3$, GaN, a composite material of Si—$SiO_2$, a composite material of Si—AlN, metal and combinations thereof.

11. A semiconductor device, comprising:
a thermoelectric separating substrate; and
at least a semiconductor component, disposed on the thermoelectric separating substrate, wherein the semiconductor component comprises:
  a substrate;
  a semiconductor working layer, disposed on the substrate, wherein an upper surface of the semiconductor working layer has a first surface area;
  an insulating layer, disposed over the upper surface of the semiconductor working layer;
  a plurality of working electrodes, disposed within the insulating layer;
  a plurality of connecting electrodes, disposed on the semiconductor working layer and electrically connected to the working electrodes, wherein a total area of the connecting electrodes occupying the upper surface of the semiconductor working layer is a second surface area; and
  at least a metal layer, floated on the semiconductor working layer, wherein a total area of the at least a metal layer occupying the upper surface of the semiconductor working layer is a third surface area, and a ratio of sum of the second surface area and the third surface area to the first surface area is 0.5 to 0.9.

12. The semiconductor device of claim 11, wherein the second surface area is less than the third surface area.

13. The semiconductor device of claim 11, wherein a ratio of the third surface area to the first surface area is 0.3 to 0.8.

14. The semiconductor device of claim 11, wherein the at least a metal layer is not in contact with the connecting electrodes.

15. The semiconductor device of claim 11, further comprising:
a thermal conducting metal layer, disposed below the thermoelectric separating substrate.

16. The semiconductor device of claim 11, wherein the insulating layer comprises $SiO_2$, $Si_3N_4$, $Al_2O_3$, nano diamond or combinations thereof.

17. The semiconductor device of claim 11, wherein the at least a semiconductor component is bonded to the thermoelectric separating substrate by metal bonding.

18. The semiconductor device of claim 11, wherein the thermoelectric separating substrate comprises an electrical conductive circuit layer and a thermal conductive metal layer, the connecting electrodes are bonded to the electrical conductive circuit layer, and the at least a metal layer is bonded to the thermal conductive metal layer.

19. The semiconductor device of claim 11, wherein the thermoelectric separating substrate is a ceramic-metal composite substrate or a polymer-metal composite substrate.

20. The semiconductor device of claim 19, wherein metal of the ceramic-metal composite substrate comprises Cu or Cu/Al alloy, and ceramic material of the ceramic-metal composite substrate comprises aluminum nitride, aluminum oxide or silicon nitride.

* * * * *